United States Patent
Jung et al.

(10) Patent No.: US 10,005,263 B2
(45) Date of Patent: Jun. 26, 2018

(54) DISPLAY DEVICE AND METHOD OF MANUFACTURING A DISPLAY DEVICE

(71) Applicant: Samsung Display Co., Ltd., Yongin (KR)

(72) Inventors: Seung-Ho Jung, Hwaseong-si (KR); Chaun-Gi Choi, Suwon-si (KR); Hye-Young Park, Seongnam-si (KR); Young-Sik Yoon, Seoul (KR); Joo-Hee Jeon, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 286 days.

(21) Appl. No.: 14/814,059

(22) Filed: Jul. 30, 2015

(65) Prior Publication Data

US 2016/0250827 A1    Sep. 1, 2016

(30) Foreign Application Priority Data

Feb. 26, 2015    (KR) .................. 10-2015-0027271

(51) Int. Cl.
*B32B 27/08*    (2006.01)
*B32B 27/28*    (2006.01)
(Continued)

(52) U.S. Cl.
CPC .............. *B32B 27/08* (2013.01); *B32B 27/16* (2013.01); *B32B 27/281* (2013.01); *B32B 37/02* (2013.01); *B32B 38/10* (2013.01); *H01L 51/5237* (2013.01); *H01L 51/5253* (2013.01); *B32B 2255/20* (2013.01); *B32B 2255/28* (2013.01); *B32B 2307/412* (2013.01); *B32B 2307/7246* (2013.01); *B32B 2310/0843* (2013.01);
(Continued)

(58) Field of Classification Search
CPC ....... B32B 27/08; B32B 27/281; B32B 27/16; B32B 37/02; B32B 38/10; B32B 2457/206; B32B 2457/20; B32B 2255/20; B32B 2307/412; B32B 2307/7246; B32B 2310/0843; H01L 51/5237; H01L 51/5253; H01L 51/003; H01L 51/3244
USPC ........................................ 428/446
See application file for complete search history.

(56) References Cited

U.S. PATENT DOCUMENTS 8,446,456 B2 *  5/2013  Foote ................... H04N 5/262
                                          348/36
8,466,456 B2    6/2013  Kim et al.
(Continued)

FOREIGN PATENT DOCUMENTS

KR    10-2011-0074284    6/2011
KR    10-2011-0092542    8/2011
(Continued)

OTHER PUBLICATIONS

Mahan et al. "Theory of Polymer Ablation", Applied Physics Letters, Dec. 12, 1988, 2377-2379, 53(24).

*Primary Examiner* — Michael M Bernshteyn
(74) *Attorney, Agent, or Firm* — H.C. Park & Associates, PLC

(57) ABSTRACT

A display device may include a first substrate, a lower barrier layer disposed on a rear surface of the first substrate, an upper barrier layer disposed on a front surface of the first substrate, a display structure disposed on the upper barrier layer, and a second substrate disposed on the display structure.

12 Claims, 8 Drawing Sheets

(51) Int. Cl.
  *B32B 38/10*  (2006.01)
  *B32B 37/02*  (2006.01)
  *H01L 51/52*  (2006.01)
  *B32B 27/16*  (2006.01)
  *H01L 51/00*  (2006.01)
  *H01L 27/32*  (2006.01)

(52) U.S. Cl.
  CPC ..... *B32B 2457/20* (2013.01); *B32B 2457/206* (2013.01); *H01L 27/3244* (2013.01); *H01L 51/003* (2013.01)

(56) References Cited

U.S. PATENT DOCUMENTS

| | | | |
|---|---|---|---|
| 9,112,188 B2 * | 8/2015 | Yang | H01L 51/56 |
| 2011/0193067 A1 | 8/2011 | Lee et al. | |
| 2012/0034451 A1 * | 2/2012 | Seo | C23C 16/345 |
| | | | 428/332 |
| 2012/0220063 A1 * | 8/2012 | Seong | H01L 33/647 |
| | | | 438/46 |
| 2014/0326963 A1 * | 11/2014 | Yang | H01L 51/56 |
| | | | 257/40 |

FOREIGN PATENT DOCUMENTS

| KR | 10-2012-0012891 | 2/2012 |
|---|---|---|
| KR | 10-1277254 | 6/2013 |

* cited by examiner

DISPLAY DEVICE AND METHOD OF MANUFACTURING A DISPLAY DEVICE

CROSS-REFERENCE TO RELATED APPLICATION

This application claims priority from and the benefit of Korean Patent Application No. 10-2015-0027271, filed on Feb. 26, 2015, which is hereby incorporated by reference for all purposes as if fully set forth herein.

BACKGROUND

Field

Exemplary embodiments of the present invention relate to display devices and method of manufacturing display devices. More particularly, exemplary embodiments of the invention relate to display devices including lower barrier layers having single layer structures to prevent a decrease of transmittance and damage thereto, and methods of manufacturing the display devices.

Discussion of the Background

Recently, various technologies for manufacturing flexible display devices have been developed using flexible substrates. A flexible substrate in a conventional flexible display device may have relatively high water vapor permeability, so that moisture may permeate inside of the flexible display device and deteriorate or damage elements of the flexible display device. Additionally, the flexible substrate may be damaged or the optical properties of the flexible substrate may be deteriorated, when the flexible substrate is separated from a support substrate when manufacturing the flexible display device.

A sacrificial layer may be formed between the support substrate and the flexible using micro crystalline silicon, titanium, or molybdenum. However, the sacrificial layer may remain on a rear face of the flexible substrate after separating the flexible substrate from the support substrate, such that the transmittance of the flexible display device may be decreased because of the remaining sacrificial layer.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide display devices including lower barrier layers having single layer structures to prevent a decrease of transmittance and damage thereof.

Exemplary embodiments of the present invention also provide methods of manufacturing the display devices including the lower barrier layers having the single layer structures.

Additional aspects will be set forth in the detailed description which follows, and, in part, will be apparent from the disclosure, or may be learned by practice of the inventive concept.

According to an exemplary embodiment of the present invention, a display device includes a first substrate, a lower barrier layer disposed on a rear surface of the first substrate, an upper barrier layer disposed on a front surface of the first substrate, a display structure disposed on the upper barrier layer, and a second substrate disposed on the display structure.

The lower barrier layer may include a single layer structure.

The lower barrier layer may include a portion disposed between the first substrate and a support substrate, the support substrate configured to support the first substrate during manufacture of the display device.

A thickness of the upper barrier layer may correspond to an energy density of a laser irradiated into the barrier layer to separate the first substrate from the support substrate.

The energy density of the laser may correspond to a hydrogen content of the barrier layer.

The lower electrode barrier layer may include silicon nitride or silicon oxynitride The upper barrier layer may include a multi layer structure.

The upper barrier layer may include silicon oxide films and silicon nitride films alternately disposed on the front surface of the first substrate.

According to an exemplary embodiment of the present invention, a method of manufacturing a display device includes forming a barrier layer on a support substrate, forming a first substrate on the barrier layer, forming an upper barrier layer on a front surface the first substrate, forming a display structure on the upper barrier layer, separating the first substrate from the support substrate using a laser irradiation process, and forming a lower barrier layer on a rear surface of the first substrate.

The laser may be irradiated into the barrier layer through the support substrate.

The lower barrier layer may include a portion of the barrier layer remaining on the rear surface of the first substrate after the laser irradiation process.

A laser ablation depth of the barrier layer by the laser may correspond to an energy density of the laser.

The barrier layer may include a single layer structure.

The barrier layer may include silicon nitride or silicon oxynitride.

The upper barrier layer may include a multi layer structure.

Forming the upper barrier layer may include alternately stacking silicon oxide films and silicon nitride films on the front surface of the first substrate.

A thickness of the lower barrier layer may be a difference between an entire thickness of the barrier layer and the laser ablation depth of the barrier layer.

The thickness of the lower barrier layer may be adjusted in accordance with the energy density of the laser.

The energy density of the laser may be adjusted in accordance with a hydrogen content of the barrier layer.

The hydrogen content of the barrier layer may be adjusted in accordance with relative flow rates of a silane ($SiH_4$) gas, an ammonia ($NH_3$) gas, and an oxygen ($O_2$) gas.

According to exemplary embodiments of the present invention, the lower barrier layer having a single layer structure may be provided on the rear face of the first substrate so that damage, deterioration, and/or degeneration of the first substrate may be significantly reduced or substantially prevented. Accordingly, failure such as haze may not be generated in the first substrate to prevent the decrease of transmittance of the display device. Further, the lower barrier layer may effectively prevent moisture and/or oxygen from permeating the inside of the display device through the first substrate, such that the display device may have improved performance and durability.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
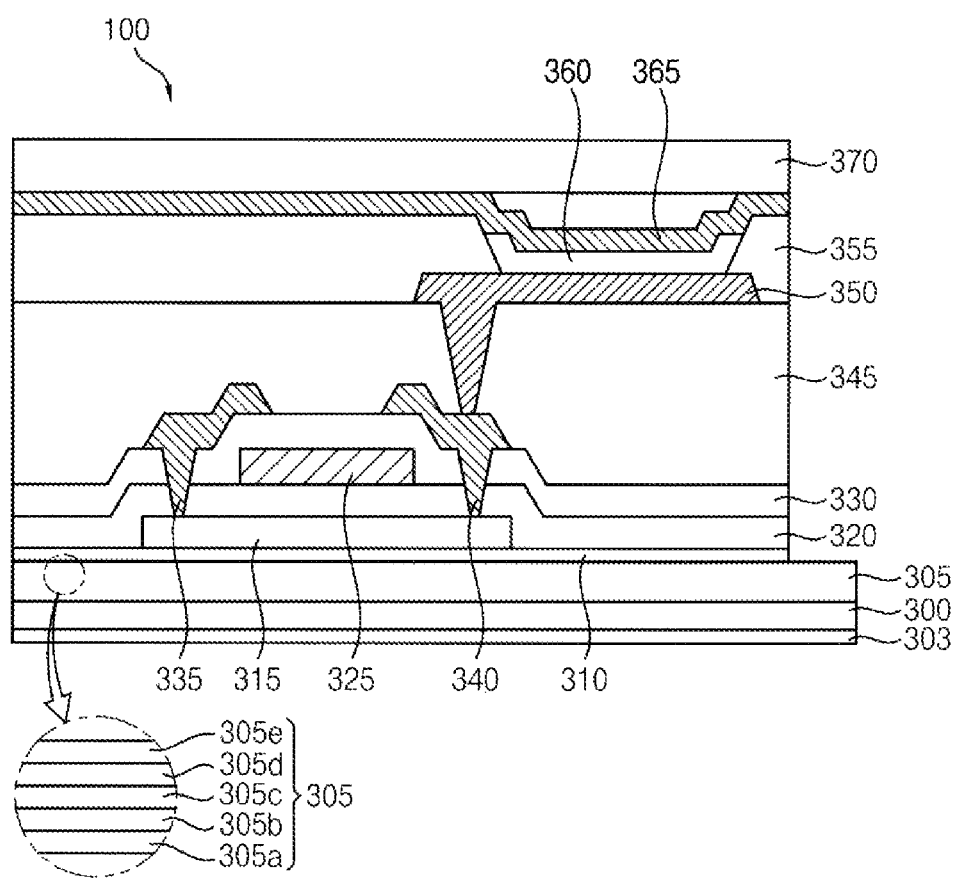
FIG. 1 is a cross-sectional view illustrating a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
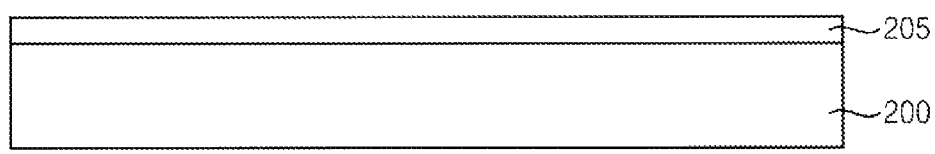
FIG. 2 is a cross-sectional view illustrating a support substrate used in manufacturing the display device of FIG. 1.

FIG. 1 is a cross-sectional view illustrating a display device according to an exemplary embodiment of the present invention. FIG. 2 is a cross-sectional view illustrating a support substrate used in manufacturing the display device of FIG. 1.

Referring to FIG. 1, a display may include a first substrate 300, a lower barrier layer 303, an upper barrier layer 305, a semiconductor device, a display structure, a second substrate 370, etc., as will be described below.

The first substrate 300 may include a transparent insulation material. For example, the first substrate 300 may include a transparent resin such as polyimide resin. When the first substrate 300 include polyimide resin, the first substrate 300 may have various advantages, for example, a sufficient mechanical strength, a good impact resistance, a good dimensional stability, a relatively high heat resistance, a relatively high friction resistance, etc. Thus, the display structure including various elements may be properly provided on the first substrate 300.

In processes for forming the display structure, as illustrated in FIG. 2, the first substrate 300 may be attached to a support substrate 200 having a barrier layer 205. After forming elements of the display structure on the first substrate 300, the first substrate 300 may be separated from the support substrate 200 by a laser irradiation. According to the present exemplary embodiment, when a laser may be irradiated into the barrier layer 205 through the support substrate 200, the barrier layer 205 may be partially decomposed by the laser so that the first substrate 300 may be separated from the support substrate 200. In this case, a portion of the barrier layer 205 may remain on a rear face of the first substrate 300 to provide the lower barrier layer 303 on the rear face of the first substrate 300.

According to the present exemplary embodiment, the barrier layer 205 may have a single layer structure including silicon compound. For example, the barrier layer 205 may include a silicon nitride (SiNx) single layer or a silicon oxynitride (SiOxNy) single layer. When the barrier layer 205 includes silicon compound, a tensile stress may be generated in the lower barrier layer 303 derived from the barrier layer 205, and the tensile stress may compensate for a compressive stress generated between the support substrate 200 and the first substrate 300, because of a difference of thermal conductivities of the support substrate 200 and the first substrate 300 while forming elements of the display device 100 on the first substrate 300. Thus, bending the first substrate 300 and/or the support substrate 200 in processes for manufacturing the display device 100 may be prevented.

When the lower barrier layer 303 is provided on the rear face of the first substrate 300, the lower barrier layer 303 may prevent moisture from permeating into the elements of the display device 100. Further, the reflection and interference of light at an interface between the lower barrier layer 303 and the first substrate 300 may be considerably reduced or substantially prevented, so that the transmittance reduction of the first substrate 300 may be significantly decreased or substantially prevented.

In a conventional flexible display device, a lower substrate may be damaged, deteriorated, or degenerated by a laser while separating the lower substrate from a support substrate by a laser irradiation process. Hence, haze failure that may decrease the transmittance of the lower layer may be generated in the lower substrate. According to the present exemplary embodiment, the lower barrier layer 303 may be disposed on the rear face of the first substrate 300 after the laser irradiation process, and thus the lower barrier layer 303 may be effectively prevent damage, deterioration, or degeneration of the first substrate 300 in the process of separating the first substrate 300 from the support substrate 200. Thus, failure such as haze may not be generated in the first substrate 300, and the transmittance of the first substrate 300 may not be substantially decreased. Further, the lower barrier layer 303 may efficiently prevent moisture and/or oxygen from permeating the inside of the display device 100, such that the display device 100 may have improved durability and performance.

According to the present exemplary embodiment, a laser ablation depth L of the barrier layer 205 in the laser irradiation process may be represented by Equation 1.

$$L = fF/h\nu nT \qquad \text{[Equation 1]}$$

In Equation 1, "f" denotes the fraction of absorbed photons capable of dissociating bonds of atoms in the barrier layer 205 and "F" denotes the energy density of the laser. In addition, "hv" denotes the energy of photons and "nT" denotes the threshold number of broken bonds per unit volume from the surface of the barrier layer 205.

Referring to the above equation, the laser ablation depth L of the barrier layer 205 (that is, a thickness of a portion of the barrier layer 205 separated from the first substrate 300) may be adjusted in accordance with the energy density F of the laser. Accordingly, as the energy density F of the laser increases, the laser ablation depth L of the barrier layer 205 may also increase. The decomposition of the barrier layer 205 may be generated in a portion of the barrier layer 205 closer to the support substrate 200 than the first substrate 300 by adjusting the energy density F of the laser. Thus, the lower barrier layer 303 may have a proper thickness on the rear face of the first substrate 300 by controlling the energy density F of the laser in the laser irradiation process. In this case, the thickness of the lower barrier layer 303 may be a difference between an entire thickness of the barrier layer 205 and the laser ablation depth L of the barrier layer 205.

Referring back to FIG. 1, the upper barrier layer 305 may be disposed on a front face of the first substrate 300 having the lower barrier layer 303. According to the present exemplary embodiment, the upper barrier layer 305 may have a multi layer structure that includes silicon oxide films and silicon nitride films alternately disposed on the first substrate 300. The upper barrier layer 305 may include a first film to a fifth film 305a, 305b, 305c, 305d and, 305e sequentially disposed on the front face of the first substrate 300. Here, the first film 305a may include silicon oxide, the second film 305b may include silicon nitride, and the third film 305c may include silicon oxide. The fourth and the fifth films 305d and 305e may include silicon nitride and silicon oxide, respectively. Each of the silicon oxide films (i.e., the first film 305a, the third film 305c, and the fifth film 305e) may have a thickness substantially larger than that of each of silicon nitride films (i.e., the second film 305b and the fourth film 305d).

According to the present exemplary embodiment, the upper barrier layer 305 and the lower barrier layer 303 may substantially block a path for moisture through the first substrate 300, so that the water vapor permeation in the first substrate 300 may be greatly decreased. Since the deterioration of the elements in the display device 100 caused by the moisture may be prevented, the display device 100 may have enhanced durability and improved performance.

As illustrated in FIG. 1, a buffer layer 310 may be positioned on the upper barrier layer 305. The buffer layer 310 may also block the permeation of moisture and/or oxygen into the inside of the display device 100, and may prevent the diffusion of impurities and/or ions from the first substrate 300. The buffer layer 310 may include silicon compound. The buffer layer 310 may have a multi layer structure that includes a silicon oxide film and a silicon nitride film. Alternatively, the buffer layer 310 may be omitted in accordance with dimensions and/or materials of the upper barrier layer 305.

The semiconductor device may be provided on the upper barrier layer 305 or the buffer layer 310. The semiconductor device may be a thin-film transistor or an oxide semiconductor device. According to the present exemplary embodiment, the semiconductor device may include an active layer 315, a gate insulation layer 320, a gate electrode 325, an insulating interlayer 330, a source electrode 335, and a drain electrode 340.

The active layer 315 may be located on the upper barrier layer 305 or the buffer layer 310. The gate insulation layer 320 may be disposed on the upper barrier layer 305 or the buffer layer 310 to cover the active layer 315. The active layer 315 may include polysilicon or oxide semiconductor. The gate insulation layer 320 may include silicon oxide or metal oxide. According to the present exemplary embodiment, the gate insulation layer 320 may have a multi layer structure including a silicon oxide film and silicon nitride film.

The gate electrode 325 may be positioned on the gate insulation layer 320 and the insulating interlayer 330 may be disposed on the gate insulation layer 320 to cover the gate electrode 325. The gate electrode 325 may include metal, alloy, metal nitride, conductive metal oxide, transparent conductive material, etc. The insulating interlayer 330 may electrically separate the gate electrode 325 from the source and the drain electrodes 335 and 340. The insulating interlayer 330 may include silicon compound. The insulating interlayer 330 may have a multi layer structure including a silicon oxide film and a silicon nitride film.

The source and the drain electrodes 335 and 340 may be located on the insulating interlayer 330. Each of the source and the drain electrodes 335 and 340 may include metal, alloy, metal nitride, conductive metal oxide, transparent conductive material, etc. The source electrode 335 and the drain electrode 340 may pass through the insulating interlayer 330 and the gate insulation layer 320, and contact with a source region and a drain region of the active layer 315, respectively.

An insulation layer 345 may be disposed on the insulating interlayer 330 to cover the source and the drain electrodes 335 and 340. The insulation layer 345 may include an insulation resin, such as acryl-based resin. The insulation layer 345 may have a substantially level surface for the display structure.

The display structure may be positioned on the insulation layer 345. The display structure may include a first electrode 350, a pixel defining layer 355, a display layer 360, and a second electrode 365. The display layer 360 may include an organic light emitting layer or a liquid crystal layer in accordance with the type of the display device 100.

The first electrode 350 may be located on the insulation layer 345. The first electrode 350 may pass through the insulation layer 345 and contact the drain electrode 340. Thus, the display structure may be electrically connected to the semiconductor device. The first electrode 350 may include metal, alloy, metal nitride, conductive metal oxide, transparent conductive material, etc. The first electrode 350 may include reflective material of transmissive material in accordance with an emission type of the display device 100. For example, the first electrode 350 may include reflective material when the display device 100 has a top emission configuration. Meanwhile, the first electrode 350 may include transmissive material when the display device 100 has a bottom emission configuration.

The pixel defining layer 355 may be disposed on the first electrode 350 and the insulation layer 345. The pixel defining layer 355 may include organic material, such as polyimide, photoresist, etc. The pixel defining layer 355 may have a pixel opening that partially exposes the first electrode 350.

The display layer 360 may be disposed on a portion of the first electrode 350 exposed by the pixel opening of the pixel defining layer 355. When the display layer 360 includes the organic light emitting layer, the display layer 360 may extend onto a sidewall of the pixel opening.

The second electrode 365 may be positioned on the pixel defining layer 355 and the display layer 360. The second electrode 365 may include metal, alloy, metal nitride, conductive metal oxide, transparent conductive material, etc. The second electrode 365 may also include reflective material of transmissive material in accordance with the emission type of the display device 100.

The second substrate 370 may be disposed on the second electrode 365. The second substrate 370 may include material substantially the same as that of the first substrate 300. For example, the second substrate 370 may include polyimide resin.

In manufacturing of the conventional display device, a sacrificial layer and a multi-layered barrier layer may be disposed between a flexible substrate and a support substrate of glass, in order to prevent the permeation of moisture into the conventional display device. However, the multi-layered barrier layer may cause reflection and interference of light, so that the transmittance of the conventional display device may be decreased. In addition, the sacrificial layer containing micro crystalline silicon, titanium, or molybdenum may be disposed between the flexible substrate and the support substrate, so as to prevent the flexible substrate from being damaged or deteriorated, however, the sacrificial layer may remain on the rear face of the flexible substrate that may reduce the transmittance of the flexible substrate and lower the yield of the conventional display device. According to the present exemplary embodiment, the barrier layer 205 having the single layer structure of silicon compound, which may serve as both of the sacrificial layer and the barrier layer of the conventional display device, may be disposed between the support substrate 200 and the first substrate 300. The lower barrier layer 303 may be formed as the remaining portion of the barrier layer 205 after separating the first substrate 300 from the support substrate 200. The haze failure caused by the damage or degeneration of the first substrate 300 may be prevented by the lower barrier layer 303 and the index difference between the lower barrier layer 303 and the first substrate 300 may be considerably reduced. Accordingly, the permeation of moisture and/or oxygen into the inside of the display device 100 may be prevented while substantially maintaining the transmittance of the first substrate 300. As a result, the display device 100 may have improved performance and enhanced durability because the deterioration of the elements of the display device 100 may be prevented.

FIGS. 3 to 10 are cross-sectional views illustrating a method of manufacturing a display device according to an exemplary embodiment of the present invention. In FIGS. 3 to 10, the same reference numerals indicate the same elements as those described with reference to FIGS. 1 and 2.

Figure 3:
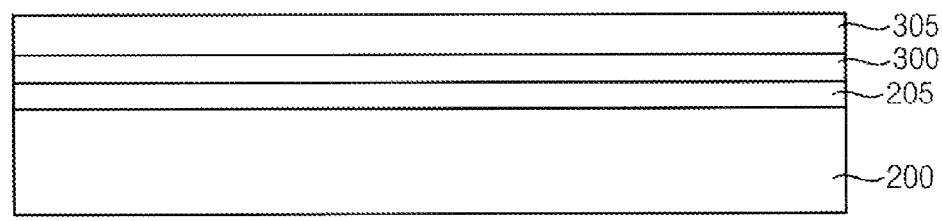
FIG. 3, FIG. 4, FIG. 5, FIG. 6, FIG. 7, FIG. 8, FIG. 9, and FIG. 10 are cross-sectional views illustrating a method of manufacturing a display device according to an exemplary embodiment of the present invention.

Referring to FIG. 3, a barrier layer 205 may be formed on a support substrate 200. The support substrate 200 may be formed using a material having a sufficient mechanical strength, a relatively high heat resistance, and a relatively high friction resistance. The support substrate 200 may be formed using glass, transparent metal oxide, etc.

The barrier layer 205 may reduce a stress generated from a difference between thermal conductivities of the support substrate 200 and a first substrate 300, in processes for forming elements of the display device. Thus, bending of the support substrate 200 and/or the first substrate 300 may be prevented by the barrier layer 205 in the processes. According to the present exemplary embodiment, the barrier layer 205 may have a single layer structure formed using silicon compound. The barrier layer 205 may be formed on the support substrate 200 as a single layer of silicon nitride or a single layer of silicon oxynitride. Further, the barrier layer 205 may be formed by a chemical vapor deposition (CVD) process, a plasma enhanced chemical vapor deposition (PECVD) process, etc.

In the chemical vapor deposition process for forming the barrier layer 205 including silicon compound, relative flow rates of process gases such as a silane ($SiH_4$) gas, an ammonia ($NH_3$) gas, and an oxygen ($O_2$) gas may be increased or decreased to control a hydrogen content of the barrier layer 205. According to the hydrogen content of the barrier layer 205, an energy density of a laser may be adjusted while the laser is irradiated into the barrier layer 205 through the support substrate 200. The energy density of the laser may decrease as the hydrogen content of the barrier layer 205 increases. When the barrier layer 205 has relatively high hydrogen content, the first substrate 300 may be easily separated from the support substrate 200 using the laser having a relatively low energy density.

Referring back to FIG. 3, the first substrate 300 may be formed on the barrier layer 205 of the support substrate 200. The first substrate 300 may include a transparent insulation resin such as polyimide resin. Hence, the first substrate 300 may have a proper mechanical strength and a sufficient impact resistance while having a relatively high heat resistance and a relatively high friction resistance.

An upper barrier layer 305 may be formed on the first substrate 300. According to the present exemplary embodiment, the upper barrier layer 305 may be obtained by alternately forming silicon oxide films and silicon nitride films on the first substrate 300. In forming the upper barrier layer 305, as illustrated in FIG. 1, a first film 305*a* may be formed on a front face of the first substrate 300 using silicon oxide, and then a second film 305*b* may be formed on the first film 305*a* using silicon nitride. After a third film 305*c* may be formed on the second film 305*b* using silicon oxide, a fourth film 305*d* may be formed on the third film 305*c* using silicon nitride. A fifth film 305*e* may be formed on the fourth film 305*d* using silicon nitride. Here, each of the first, the third and the fifth films 305*a*, 305*c* and 305*e* (i.e., silicon oxide films) may have a thickness substantially larger than a thickness of each of the second and the fourth films 305*b* and 305*d* (i.e., silicon nitride films).

Figure 4:
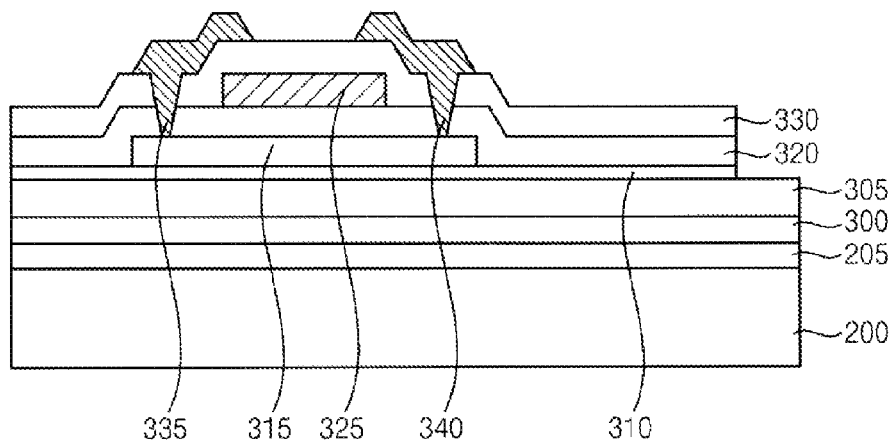

Referring to FIG. 4, a buffer layer 310 may be formed on the upper barrier layer 305. The buffer layer 310 may be formed using silicon compound. According to the present exemplary embodiment, the buffer layer 310 may be obtained by stacking a silicon oxide film and a silicon nitride film on the upper barrier layer 305. More particularly, the buffer layer 310 may have a multi layer structure that includes the silicon oxide film and the silicon nitride film. Alternatively, the buffer layer 310 may be omitted in accordance with materials and dimensions of the upper barrier layer 305.

An active layer 315 may be formed on the buffer layer 310 or the upper barrier layer 305. The active layer 315 may be formed using polysilicon, oxide semiconductor, etc. A gate insulation layer 320 may be formed on the active layer 315. The gate insulation layer 320 may be formed on the buffer layer 310 or the upper barrier layer 305 to sufficiently cover the active layer 315. The gate insulation layer 320 may be formed using silicon oxide, metal oxide, etc.

A gate electrode 325 may be formed on the gate insulation layer 320. The gate electrode 325 may be positioned on a portion of the gate insulation layer 320 over the active layer 315. The gate electrode 325 may be formed using metal, alloy, metal nitride, conductive metal oxide, transparent conductive material, etc.

An insulating interlayer 330 may be formed on the gate electrode 325. The insulating interlayer 330 may be formed on the gate insulation layer 320 to completely cover the gate electrode 325. The insulating interlayer 330 may be formed using silicon compound. The insulating interlayer 330 may be obtained by forming a silicon nitride film and a silicon oxide film on the gate insulation layer 320 and the gate electrode 325. The insulating interlayer 330 may electrically separate the gate electrode 325 from a source electrode 335 and a drain electrode 340 formed successively.

The source and the drain electrodes 335 and 340 may be formed on the insulating interlayer 330. According to the present exemplary embodiment, the insulating interlayer 330 and the gate insulation layer 320 may be partially removed to form contact holes that expose a source region and a drain region of the active layer 315. The source and the drain electrodes 335 and 340 may be formed on the insulating interlayer 330 to fill the contact holes. Thus, the source and the drain electrodes 335 and 340 may contact the source and the drain regions of the active layer 315, respectively. The source and the drain electrodes 335 and 340 may be formed using metal, alloy, metal nitride, conductive metal oxide, transparent conductive material layer, etc. Accordingly, a semiconductor device may be formed on the buffer layer 310 or the upper barrier layer 305. According to the present exemplary embodiment, the barrier layer 205 including nitride and the upper barrier layer 305 containing nitride may reduce or absorb a stress generated in the processes for forming the semiconductor device, so that bending of the support substrate 200 and/or the first substrate 300 may be prevented in the formation of the semiconductor device.

Figure 5:
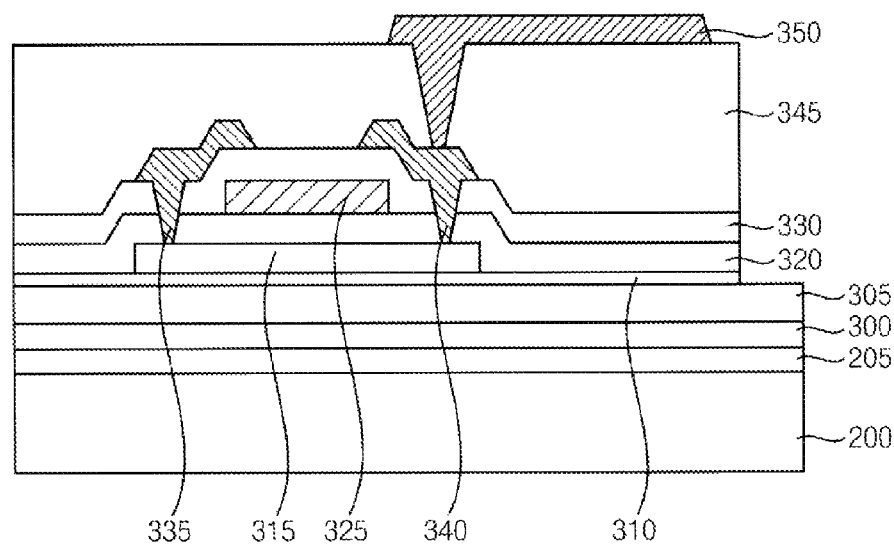

Referring to FIG. 5, an insulation layer 345 may be formed on the insulating interlayer 330 to cover the source and the drain electrodes 335 and 340. The insulation layer 345 may be formed using insulation resin such as acryl-based resin. The insulation layer 345 may have a substantially level surface while sufficiently covering the source and the drain electrodes 335 and 340.

A first electrode 350 may be formed on the insulation layer 345. The first electrode 350 may be formed using metal, metal nitride, alloy, conductive metal oxide, transparent conductive material, etc. The first electrode 350 may be formed using reflective material or transmissive material in accordance with an emission type of the display device. According to the present exemplary embodiment, the insulation layer 345 may be partially removed to form a contact hole exposing the drain electrode 340, and then the first electrode 350 may be formed on the insulation layer 345 to fill the contact hole. Thus, the first electrode 350 may be electrically connected to the drain electrode 340.

Figure 6:
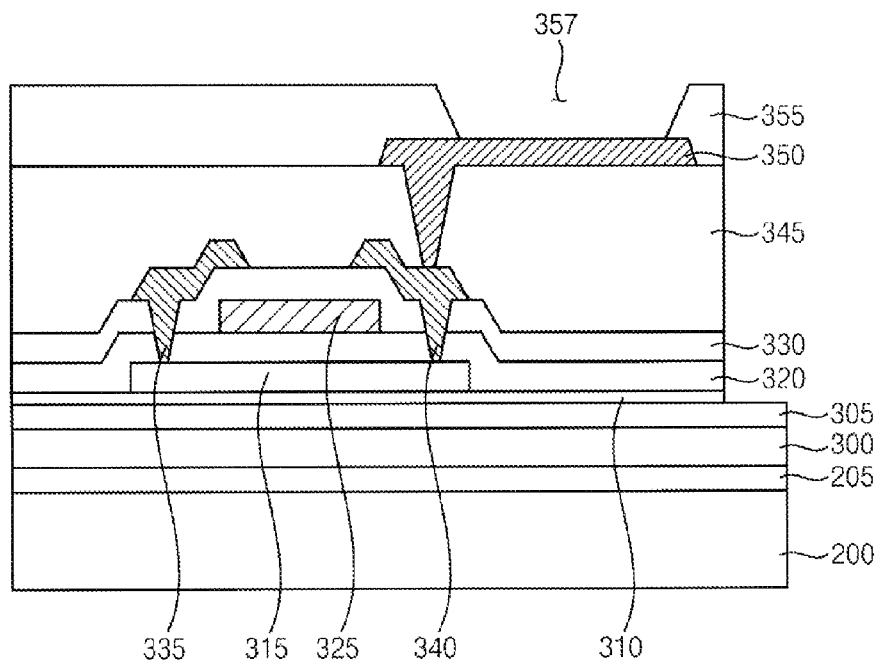

Referring to FIG. 6, a pixel defining layer 355 may be formed on the first electrode 350 and the insulation layer 345. The pixel defining layer 355 may be formed using organic material such as polyimide, photoresist, etc. The, the pixel defining layer 355 may be partially removed to form a pixel opening 357 that exposes a portion of the first electrode 350.

Figure 7:
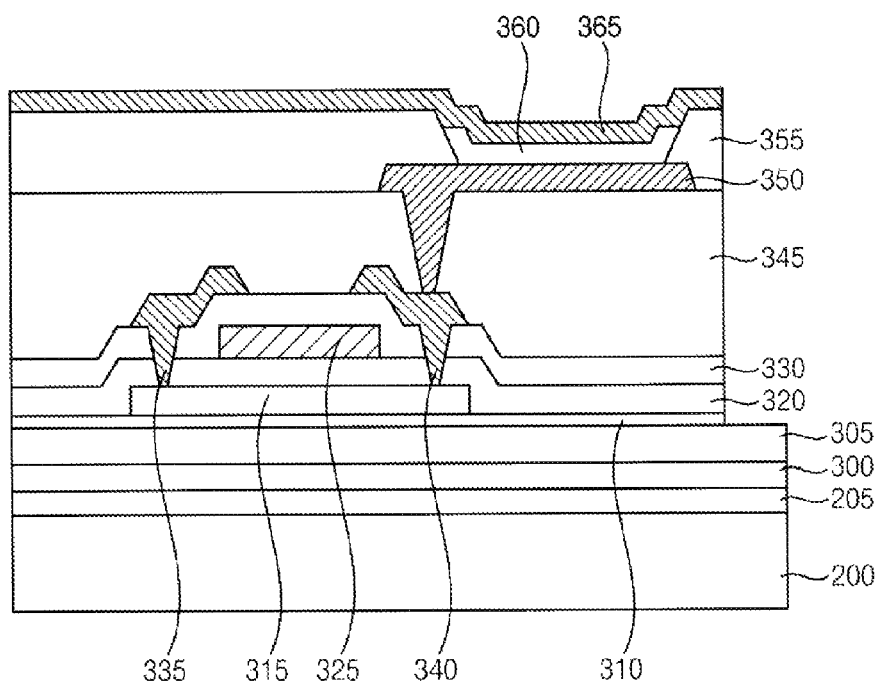

Referring to FIG. 7, a display layer 360 may be formed on the exposed portion of the first electrode 350 in the pixel opening 357 of the pixel defining layer 355. The display layer 360 may include an organic light emitting layer or a liquid crystal layer in accordance with the type of the display device. When the display layer 360 includes the organic light emitting layer, the display layer 360 may be formed on the first electrode 350 and a sidewall of the pixel opening 357.

A second electrode 365 may be formed on the display layer 360 and the pixel defining layer 355. The second electrode 365 may be formed using metal, metal nitride, alloy, conductive metal oxide, transparent conductive material, etc. The second electrode 365 may also be formed using reflective material or transmissive material in accordance with the emission type of the display device.

Figure 8:
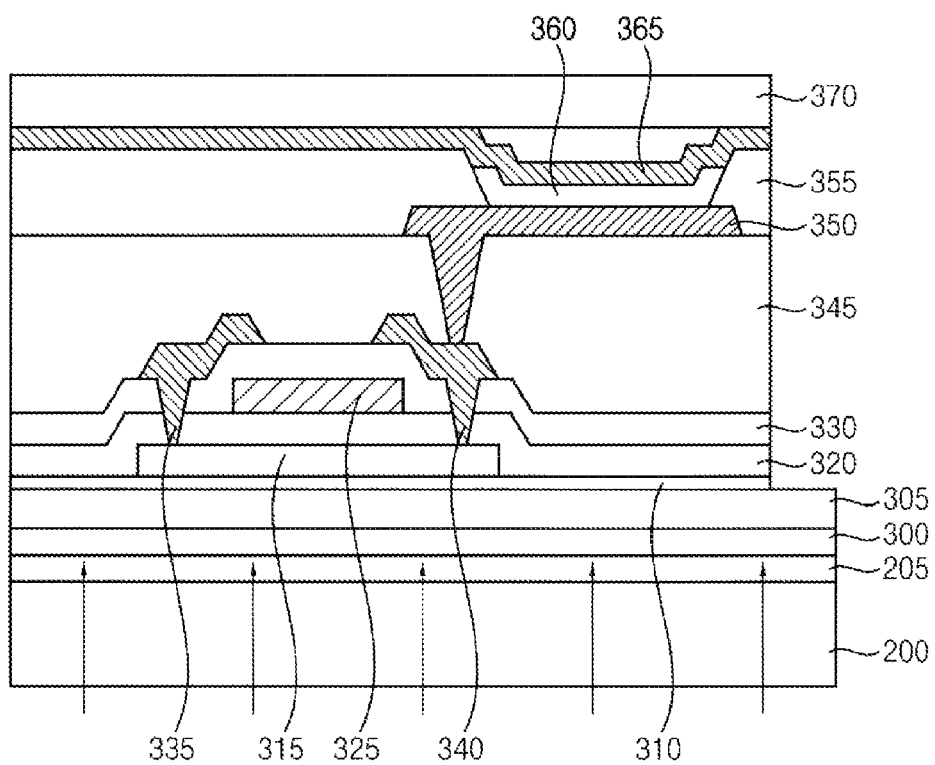

Referring to FIG. 8, a second substrate 370 may be formed on the second electrode 365. The second substrate 370 may be formed using material substantially the same as that of the first substrate 300. The second substrate 370 may be formed using a transparent insulation resin such as polyimide resin.

Figure 9:
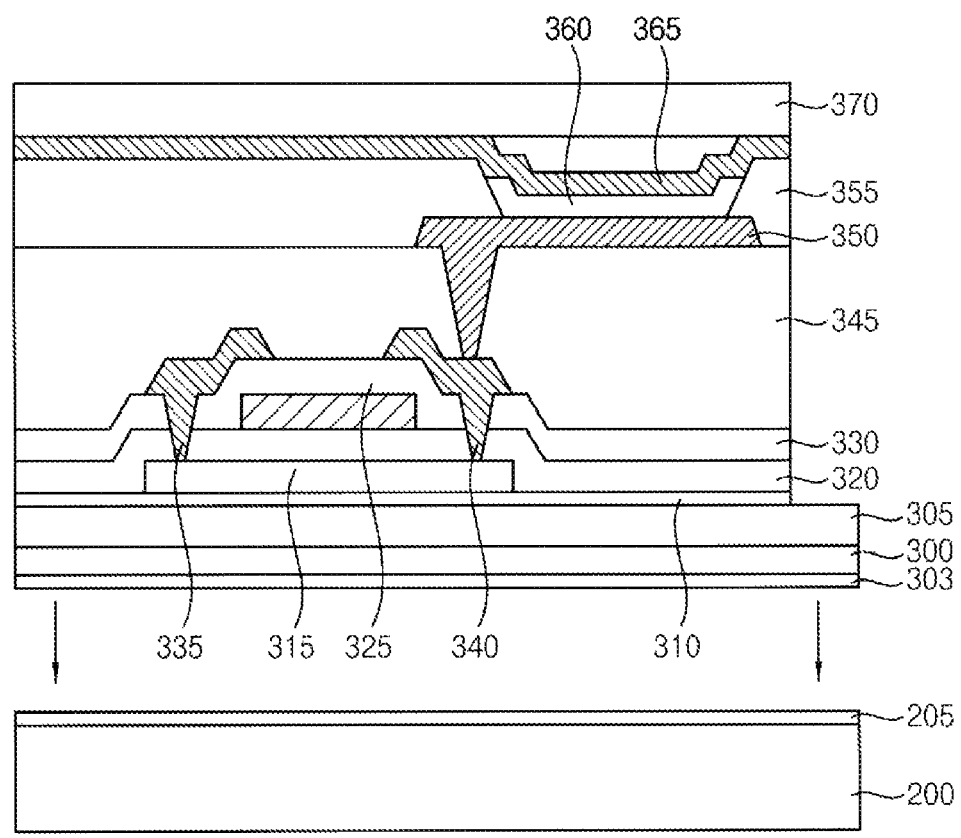
Figure 10:
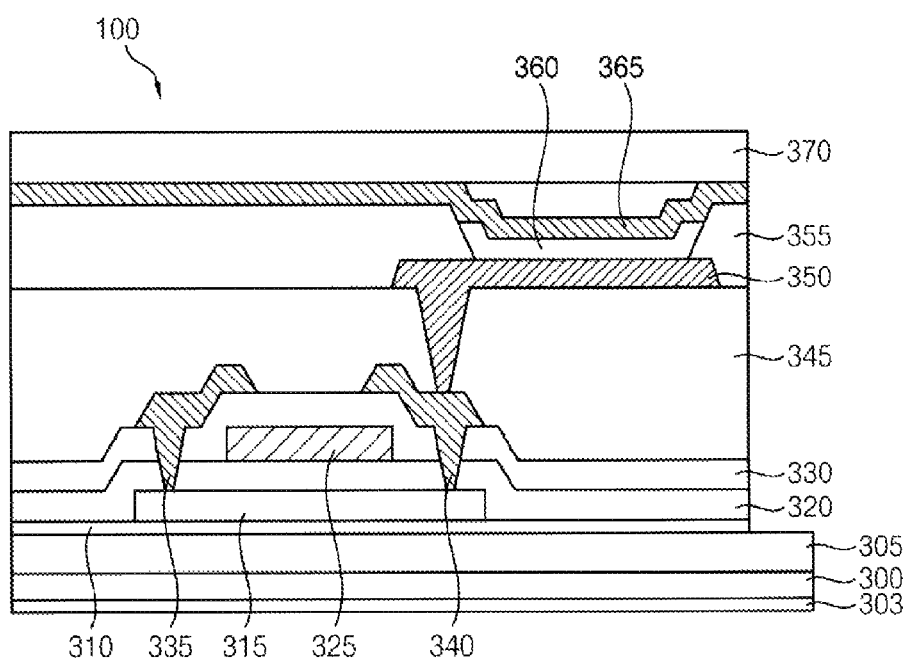

Referring to FIGS. 8 and 9, a laser having a predetermined energy density may be irradiated into the barrier layer 205 through the support substrate 200, so that the support substrate 200 may be separated from the first substrate 300 having the above-described elements of the display device thereon. More particularly, the first substrate 300 may be separated from the support substrate 200 by a laser irradiation process. As a result, the display device 100 illustrated in FIG. 10 may be obtained.

According to the present exemplary embodiment, as illustrated in FIG. 9, a portion of the barrier layer 205 may remain on a rear face of the first substrate 300 such that a lower barrier layer 303 may be formed on the rear face of the first substrate 300. The lower barrier layer 303 derived from the barrier layer 205 may also have a single layer structure.

As described above, the laser ablation depth of the barrier layer 205 may be adjusted in accordance with the energy density of the laser irradiated into the barrier layer 205, and thus the thickness of the lower barrier layer 303 may be controlled by the total thickness of the barrier layer 205 and the energy density of the laser. More particularly, the thickness of the lower barrier layer 303 may be adjusted by increasing or decreasing the energy density of the laser and/or the thickness of the barrier layer 205. When the lower barrier layer 303 derived from the barrier layer 205 may be formed on the rear face of the first substrate 300, the damage or deterioration of the first substrate 300 may be prevented, and also the permeation of moisture and/or oxygen may be blocked, so that the durability and the performance of the display device 100 may be improved.

Figure 11:
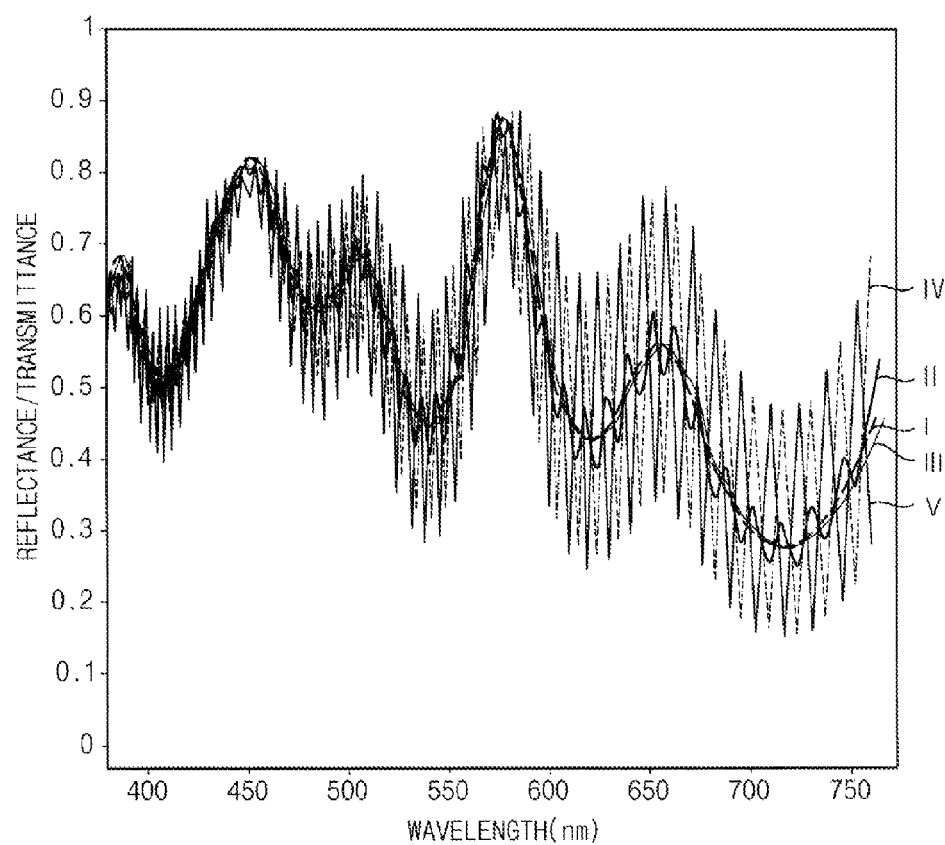
FIG. 11 is a graph showing the results of simulation for the transmittances of display devices in accordance with the configurations of lower barrier layers.

FIG. 11 is a graph showing simulation results of transmittances of display devices in accordance with the configurations of lower barrier layers. FIG. 11 shows the simulation results of a display device having no lower barrier layer (I), a display device having a lower barrier layer including a silicon nitride film (II), a display device having a lower barrier layer including a silicon oxynitride film (III), a display device having a lower barrier layer including silicon oxide films and a silicon nitride film (IV), and a display device having a lower barrier layer including a silicon oxide film and silicon nitride films (V).

Table 1 shows the respective transmittances of the display devices (I, II, III, IV, and V) for visible light at wavelengths of about 430 nm, about 550 nm, and about 650 nm, and the average transmittances of the display devices (I, II, III, IV, and V) for visible light having a wavelength of about 380 nm to about 760 nm.

TABLE 1

| Type of lower barrier layer | Transmittance (%) | | | |
| --- | --- | --- | --- | --- |
| | 430 nm | 550 nm | 650 nm | Average (380 nm-760 nm) |
| No lower barrier layer (I) | 67.0 | 48.5 | 54.9 | 59.8 |
| Lower barrier layer including a silicon nitride film having a thickness of about 3,600 Å (II) | 67.3 | 46.7 | 57.2 | 59.5 |
| Lower barrier layer including a silicon oxynitride film having a thickness of about 3,600 Å (III) | 66.7 | 48.5 | 54.9 | 59.8 |
| Lower barrier layer including a silicon oxide film having a thickness of about 1,500 Å, a silicon nitride film having a thickness of about 600 Å and a silicon oxide film having a thickness of about 1,500 Å (IV) | 68.5 | 68.1 | 43.8 | 55.6 |
| Lower barrier layer including a silicon nitride film having a thickness of about 1,500 Å, a silicon oxide film having a thickness of about 600 Å and a silicon nitride film having a thickness of about 1,500 Å (V) | 68.6 | 37.0 | 67.5 | 56.9 |

As shown in Table 1 and FIG. 11, the display device (IV), which has the lower barrier layer including the silicon oxide films and the silicon nitride film, has the average transmittance of about 55.6%. Additionally, the display device (V), which has the lower barrier layer including the silicon oxide film and the silicon nitride films, has the average transmittance of about 56.9%. Thus, the display device may have a decreased transmittance when the display device includes the lower barrier layer of the multi layer structure.

Meanwhile, the display device (II) having the lower barrier layer including the silicon oxide film has the average transmittance of about 59.5%, and the display device (III) having the lower barrier layer including the silicon oxynitride film has the average transmittance of about 59.8%. The reduction of the transmittance of the display devices (II and III) may be substantially smaller than that of the display devices (IV and V). Therefore, the display devices (II and III) including the lower barrier layers of the single layer structures may have the transmittances similar to that of the display device (I) having no lower barrier layer.

The display device according to the exemplary embodiments of the present invention may be employed in various electric and electronic apparatuses to improve performances and durabilities of the apparatuses. For example, the display device including the lower barrier layer may be advantageously used in a smart television, a smart phone, a notebook, a tablet, a smart pad, a digital camera, etc.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A method of manufacturing a display device, the method comprising:
   forming a barrier layer on a support substrate;
   forming a first substrate on the barrier layer;
   forming an upper barrier layer on a front surface the first substrate;
   forming a display structure on the upper barrier layer;
   separating the first substrate from the support substrate using a laser irradiation process; and
   forming a lower barrier layer on a rear surface of the first substrate.

2. The method of claim 1, wherein a laser is irradiated into the barrier layer through the support substrate in the laser irradiation process.

3. The method of claim 2, wherein the lower barrier layer comprises a portion of the barrier layer remaining on the rear surface of the first substrate after the laser irradiation process.

4. The method of claim 2, wherein a laser ablation depth of the barrier layer by the laser corresponds to an energy density of the laser.

5. The method of claim 2, wherein the barrier layer comprises a single layer structure.

6. The method of claim 5, wherein the barrier layer comprises silicon nitride or silicon oxynitride.

7. The method of claim 5, wherein the upper barrier layer comprises a multi layer structure.

8. The method of claim 7, wherein forming the upper barrier layer comprises alternately stacking silicon oxide films and silicon nitride films on the front surface of the first substrate.

9. The method of claim 4, wherein a thickness of the lower barrier layer is a difference between an entire thickness of the barrier layer and the laser ablation depth of the barrier layer.

10. The method of claim 9, wherein the thickness of the lower barrier layer is adjusted in accordance with the energy density of the laser.

11. The method of claim 10, wherein the energy density of the laser is adjusted in accordance with a hydrogen content of the barrier layer.

12. The method of claim 11, wherein the hydrogen content of the barrier layer is adjusted in accordance with relative flow rates of a silane ($SiH_4$) gas, an ammonia ($NH_3$) gas, and an oxygen ($O_2$) gas.

* * * * *